(12) United States Patent
Han (10) Patent No.: US 11,457,534 B2
(45) Date of Patent: Sep. 27, 2022

(54) FOLDABLE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Wen Han, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 133 days.

(21) Appl. No.: 17/057,431

(22) PCT Filed: Jun. 23, 2020

(86) PCT No.: PCT/CN2020/097786
§ 371 (c)(1),
(2) Date: Nov. 20, 2020

(87) PCT Pub. No.: WO2021/232528
PCT Pub. Date: Nov. 25, 2021

(65) Prior Publication Data
US 2022/0192037 A1   Jun. 16, 2022

(30) Foreign Application Priority Data
May 19, 2020   (CN) .................. 202010424593.X (51) Int. Cl.
*H05K 5/02* (2006.01)
*H05K 5/00* (2006.01)
(Continued)

(52) U.S. Cl.
CPC ....... *H05K 5/0213* (2013.01); *B01D 46/0005* (2013.01); *B01D 46/4272* (2013.01);
(Continued)

(58) Field of Classification Search
CPC .. H05K 5/0213; H05K 5/0017; H05K 5/0226; B01D 46/58; B01D 46/0005;
(Continued)

(56) References Cited

U.S. PATENT DOCUMENTS 10,165,694 B1 * 12/2018 Werner .................. G06F 1/163
11,314,284 B2 *  4/2022 Kim ..................... G06F 1/1652
(Continued)

FOREIGN PATENT DOCUMENTS

CN     103105966 A     5/2013
CN     106205384 A    12/2016
(Continued)

*Primary Examiner* — Abhishek M Rathod
*Assistant Examiner* — Keith DePew (57) ABSTRACT

A foldable display device is provided. The foldable display device includes a flexible display module, a bottom frame, middle frames, and a connecting member. Two ends of the connecting member are provided with filter components. An accommodating cavity is formed among the flexible display module, the middle frames and the bottom frame communicating with an external environment through the filter components, so as to prevent the dust generated by the friction of components of the connecting member and the dust entering the accommodating cavity from the external environment, thereby avoiding short circuits and display malfunction of the foldable display device.

18 Claims, 11 Drawing Sheets

(51) Int. Cl.
  *B01D 46/58* (2022.01)
  *B01D 46/00* (2022.01)
  *B01D 46/42* (2006.01)

(52) U.S. Cl.
  CPC ........... *B01D 46/58* (2022.01); *H05K 5/0017* (2013.01); *H05K 5/0226* (2013.01); *B01D 2265/02* (2013.01); *B01D 2279/35* (2013.01); *B01D 2279/45* (2013.01)

(58) Field of Classification Search
  CPC ............ B01D 46/4272; B01D 2265/02; B01D 2279/35; B01D 2279/45
  See application file for complete search history.

(56) References Cited

U.S. PATENT DOCUMENTS

2010/0041439 A1   2/2010  Bullister
  2013/0120674 A1   5/2013  Lee
  2016/0037243 A1*  2/2016  Lippert .................. H04R 1/023
                                              381/166
  2020/0341523 A1* 10/2020  Chen ..................... G06F 1/1652
  2020/0409428 A1* 12/2020  Wang .................... G06F 1/1652
  2021/0067614 A1*  3/2021  Cheng ................... G06F 1/1681
  2021/0173449 A1*  6/2021  Yao ....................... G06F 1/1652
  2021/0274028 A1*  9/2021  Park .................... H04M 1/0222
  2021/0373609 A1* 12/2021  Kim ..................... G06F 1/1681
  2022/0129043 A1*  4/2022  Morrison .............. G06F 1/1681

FOREIGN PATENT DOCUMENTS

CN        107331302 A      11/2017
  CN        108415522 A       8/2018
  CN        208173136 U      11/2018
  CN        109461383 A       3/2019
  CN        109637377 A   *   4/2019   ............ G09F 9/301
  CN        109637377 A       4/2019
  CN        110459131 A      11/2019
  JP       2005338589 A      12/2005

* cited by examiner

FOLDABLE DISPLAY DEVICE

FIELD OF INVENTION

The present disclosure relates to the fields of display technology, in particular to foldable display devices.

BACKGROUND OF INVENTION

With the development of display technologies, consumers' demands for display panel are more and more diversified and personalized. Foldable display devices have the advantages of bendability and portability, which is favored by the consumers.

Technical problem: during the process of unfolding or folding the foldable display device, many components of the connecting mechanism also move, and frictions between each other generate dust. In addition, because an internal space of the existing foldable display device is not sealed off, the dust in the external environment may enter the foldable display devices through gaps between the components of the connecting mechanism, and the dust may cause short circuits and display malfunction the foldable display device.

In view of above, the existing foldable display devices have the problems of short circuits and display malfunction due to the dust generated during the folding process or the dust entering the device from the external environment. Therefore, it is necessary to provide a foldable display device to improve the above-mentioned drawback.

SUMMARY OF INVENTION

The embodiments of the present disclosure provide foldable display devices, which are used to solve the problems of short circuits and display malfunction of the existing foldable display devices due to the dust generated during the folding process or the dust entering the device from the external environment.

An embodiment of the present disclosure provides a foldable display device, comprising a flexible display module; a bottom frame configurated for making the flexible display module in a flattened state and a folded state; two middle frames; and a connecting member, wherein the middle frames and the connecting member are disposed on the bottom frame, the two middle frames are respectively arranged on both sides of the connecting member and rotatably connected with the connecting member, and the flexible display module is disposed on the middle frame and covering the connecting member, and wherein filter components are provided on two ends of the connecting member, and an accommodating cavity is formed among the flexible display module, the middle frames and the bottom frame communicating with an external environment through the filter components.

According to an embodiment of the present disclosure, the connecting member comprises hinge covers, a limit support housing and a rotation member, the hinge covers disposed on two ends of the limit support housing, the rotation member disposed between the hinge cover and the limit support housing, and the filter component disposed on a side of the rotation member away from the hinge cover.

According to an embodiment of the present disclosure, the limit support housing comprises a first support plate and two second support plates located on both ends of the first support plate; and a slot recessed toward a bottom surface direction provided on a top surface of the second support plate, and the filter component disposed in the slot.

According to an embodiment of the present disclosure, the filter component comprises a filter mesh.

According to an embodiment of the present disclosure, the rotation member comprises two rotation shafts and two gears meshing with each other, the gear movably connected with the hinge cover through the rotation shaft, and wherein a fan blade component is provided on a side of the second support plate away from the rotation member, and one of the two rotation shafts penetrates the second support plate and is fixedly connected with the fan blade component.

According to an embodiment of the present disclosure, connecting portions provides on two ends of a side of the middle frame closed to the connecting member, an end of the connecting portion provided with a zigzag structure distributed in an arc shape, and the zigzag structure meshes with the gear.

According to an embodiment of the present disclosure, the filter component comprises a diaphragm type check valve.

According to an embodiment of the present disclosure, the filter component further comprises elastic hooks provided on both sides, and a limiting groove is provided in the slot corresponding to the elastic hook.

According to an embodiment of the present disclosure, ventilation holes corresponding to the filter component are provided on both sides of the slot.

According to an embodiment of the present disclosure, the slot penetrates from the top surface of the second support plate to a bottom surface of the second support plate.

An embodiment of the present disclosure provides a foldable display device, comprising a flexible display module; a bottom frame configurated for making the flexible display module in a flattened state and a folded state; two middle frames; and a connecting member, wherein the middle frames and the connecting member are disposed on the bottom frame, the two middle frames are respectively arranged on both sides of the connecting member and rotatably connected with the connecting member, and the flexible display module is disposed on the middle frame and covering the connecting member, wherein the connecting member comprises hinge covers, a limit support housing and a rotation member, the hinge covers disposed on two ends of the limit support housing, the rotation member disposed between the hinge cover and the limit support housing, the limit support housing comprises a first support plate and two second support plates located on both ends of the first support plate; and a slot recessed toward a bottom surface direction provided on top surfaces of the two second support plate, the filter component disposed in the slot, and an accommodating cavity formed among the flexible display module, the middle frames and the bottom frame communicating with an external environment through the filter components.

According to an embodiment of the present disclosure, the filter component comprises a filter mesh.

According to an embodiment of the present disclosure, the rotation member comprises two rotation shafts and two gears meshing with each other, the gear movably connected with the hinge cover through the rotation shaft; and wherein a fan blade component is provided on a side of the second support plate away from the rotation member, and one of the two rotation shafts penetrates the second support plate and is fixedly connected with the fan blade component.

According to an embodiment of the present disclosure, connecting portions provides on two ends of a side of the middle frame closed to the connecting member, an end of the connecting portion provided with a zigzag structure distributed in an arc shape, and the zigzag structure meshes with the gear.

According to an embodiment of the present disclosure, the filter component comprises a diaphragm type check valve.

According to an embodiment of the present disclosure, the filter component further comprises elastic hooks provided on both sides, and a limiting groove is provided in the slot corresponding to the elastic hook.

According to an embodiment of the present disclosure, ventilation holes corresponding to the filter component are provided on both sides of the slot.

According to an embodiment of the present disclosure, the slot penetrates from the top surface of the second support plate to a bottom surface of the second support plate.

An embodiment of the present disclosure yet provides a foldable display device, comprising a flexible display module; a bottom frame configured for making the flexible display module in a flattened state and a folded state; two middle frames; and a connecting member, wherein the middle frames and the connecting member are disposed on the bottom frame, the two middle frames are respectively arranged on both sides of the connecting member and rotatably connected with the connecting member, and the flexible display module is disposed on the middle frame and covering the connecting member, wherein the connecting member comprises hinge covers, a limit support housing and a rotation member, the hinge covers disposed on two ends of the limit support housing, and the rotation member disposed between the hinge cover and the limit support housing, the limit support housing comprises a first support plate and two second support plates located on both ends of the first support plate, a slot recessed toward a bottom surface direction provided on a top surface of the two second support plate, and a filter component disposed in the slot, wherein the filter component comprises a filter mesh and elastic hooks provided on both sides; a limiting groove is provided in the slot corresponding to the elastic hook; and an accommodating cavity is formed among the flexible display module, the middle frames and the bottom frame communicating with an external environment through the filter components.

According to an embodiment of the present disclosure, the rotation member comprises two rotation shafts and two gears meshing with each other, the gear movably connected with the hinge cover through the rotation shaft; a fan blade component provided on a side of the second support plate away from the rotation member, and one of the two rotation shafts penetrates the second support plate and is fixedly connected with the fan blade component.

Beneficial effect: the embodiments of the present disclosure provide a foldable display device. By providing a filter component on two ends of the connecting member, an accommodating cavity is formed among the flexible display module, the middle frames and the bottom frame communicating with an external environment through the filter components, so as to prevent the dust generated by the friction of components of the connecting member and the dust entering the accommodating cavity from the external environment, thereby avoiding short circuits and display malfunction of the foldable display device.

DRAWINGS

In order to more clearly explain the embodiments of the present disclosure or the technical solution in the prior art, the following description describes a brief introduction to the accompanying drawings required used in the description of the embodiments of the present disclosure or prior art. It is apparent that the drawings in conjugation with the following description only disclose some of the embodiments. For those ordinary skilled in the art, they can also obtain other drawings on the basis of these drawings without paying creative work.

DETAILED DESCRIPTION OF EMBODIMENTS

The description of the following embodiments refers to the attached drawings to illustrate specific embodiments that the present disclosure can be implemented. The directional terms mentioned in this disclosure, such as up, down, front, rear, left, right, inside, outside, lateral, etc., are only the direction of the attached drawings. Therefore, the used directional terms are used to illustrate and understand the present disclosure, rather than to limit the present disclosure. In the drawings, units with similar structures are indicated by the same reference numerals.

The present disclosure is further explained in conjugation with the attached drawings and specific embodiments.

Figure 1:
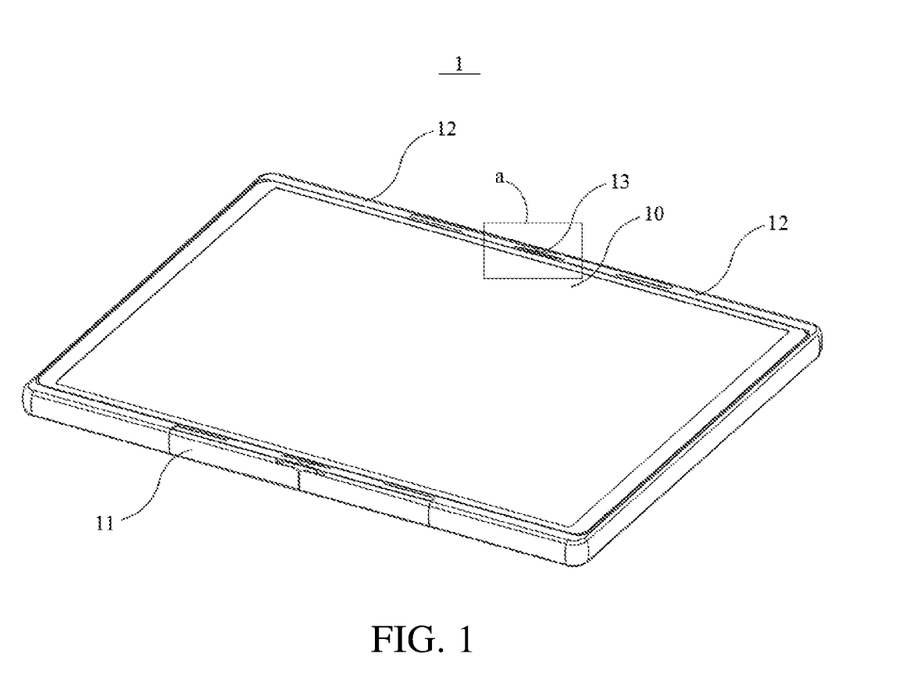
FIG. 1 is a structural schematic view of a foldable display device in a flattened state provided by an embodiment of the present disclosure.
Figure 2:
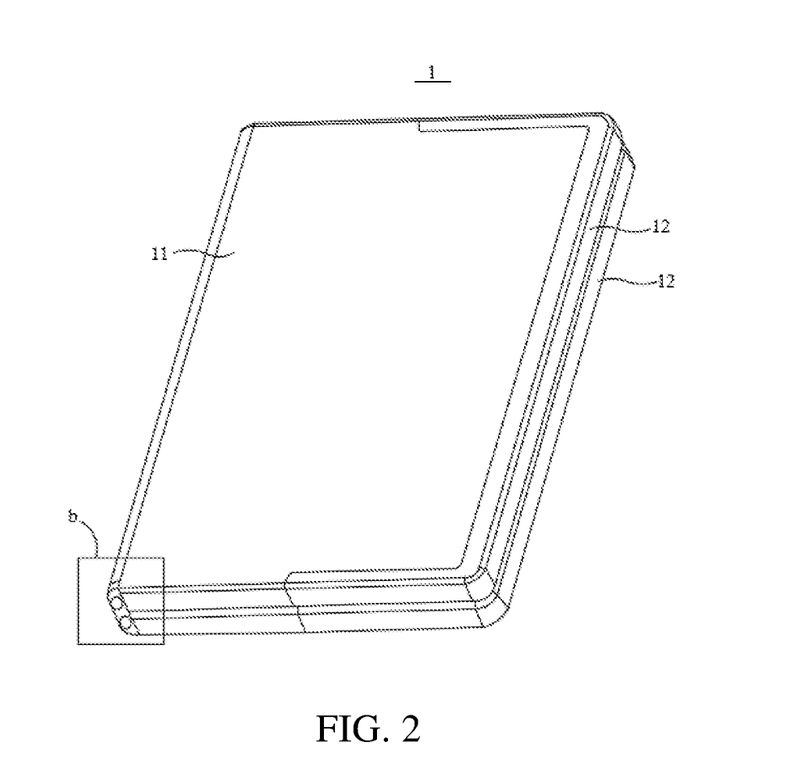
FIG. 2 is a structural schematic view of a foldable display device in a folded state provided by an embodiment of the present disclosure.
Figure 3:
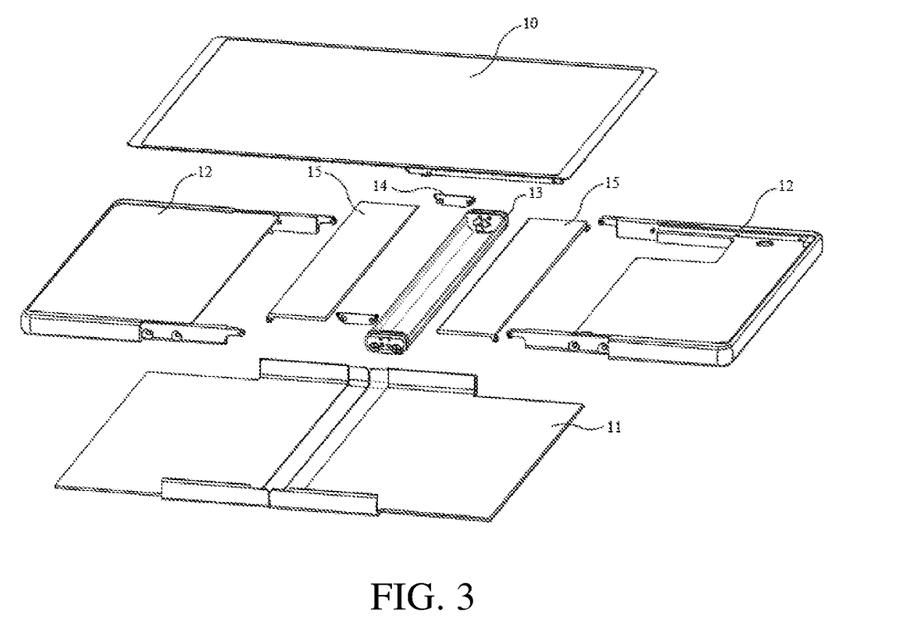
FIG. 3 is a schematic view of an exploded structure of a foldable display device provided by an embodiment of the present disclosure.

An embodiment of the present disclosure provides a foldable display device, which is described in detail in conjugation with FIGS. 1 to 3. FIG. 1 is the structural schematic view of a foldable display device in a flattened state provided by an embodiment of the present disclosure, FIG. 2 is the structural schematic view of a foldable display device in a folded state provided by an embodiment of the present disclosure, and FIG. 3 is a schematic view of an exploded structure of a foldable display device provided by an embodiment of the present disclosure. The foldable display device 1 includes a flexible display module 10, which includes a bottom frame 11, two middle frames 12, a connecting member 13 and two movable support plates 15, which are configured for making the flexible display module 10 in a flattened state and a folded state.

The two middle frames 12 and the connecting member 13 are disposed on the bottom frame 11. The two middle frames 12 are respectively arranged on two sides of the connecting member 13 and are rotatably connected with the connecting member 13. The two movable support plates 15 are arranged side by side and detachably disposed on the connecting member 13. Distal sides of the two movable support plates 15 are separately rotatably connected with each corresponding side of the middle frames 12. The flexible display module 10 is disposed on the two middle frame 12 and covered the connecting member 13 and the two movable supporting plates 15. A filter component 14 are provided on both ends of the connecting member 13. An accommodating cavity is formed among the flexible display module 10, the two middle frames 12 and the bottom frame 11 communicating with an external environment through the filter components 14, and the accommodating cavity can fold an internal space of the display device 1.

Figure 4:
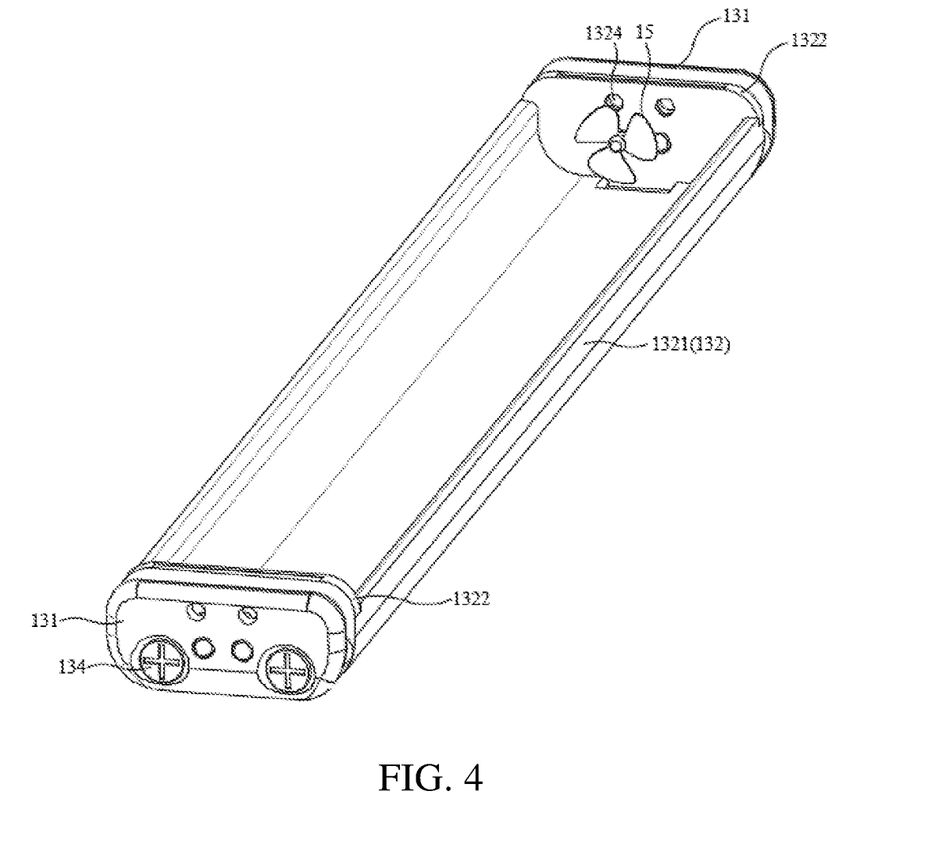
FIG. 4 is a structural schematic view of a connecting member provided by an embodiment of the present disclosure.
Figure 5:
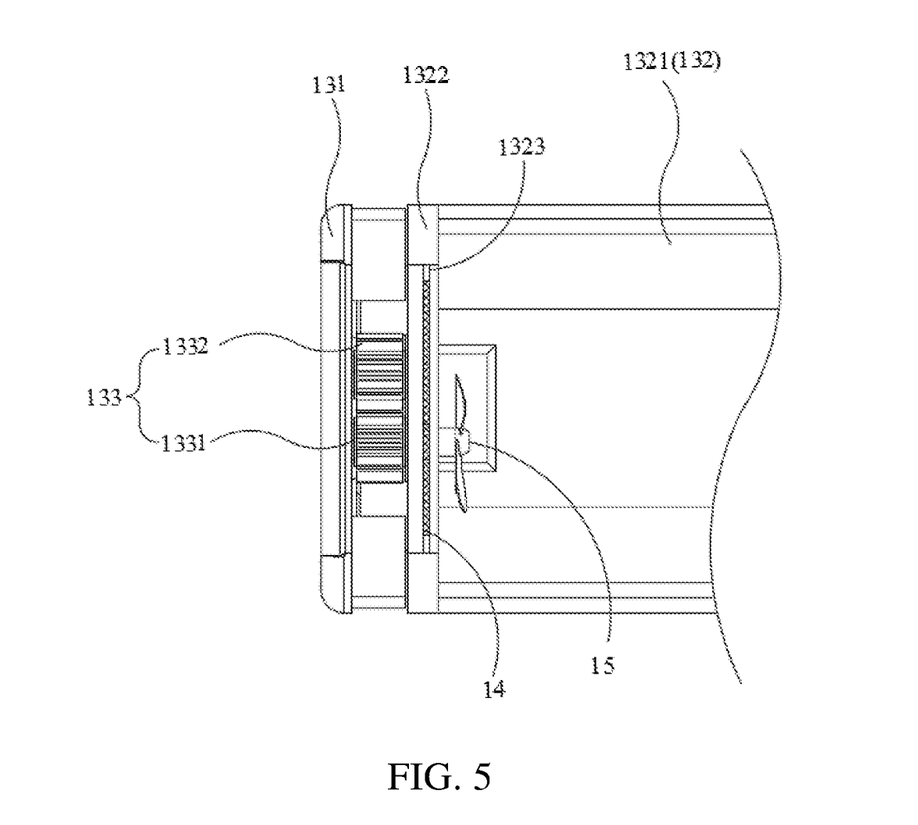
FIG. 5 is a top view of one end of the connecting member provided in FIG. 4.
Figure 6:
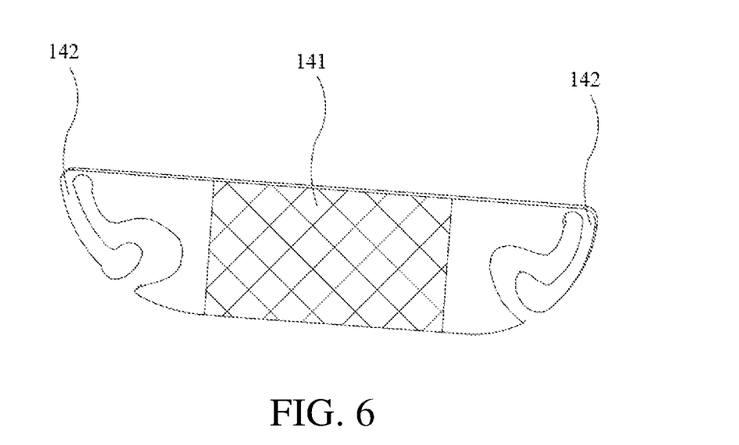
FIG. 6 is a structural schematic view of a filter component provided by an embodiment of the present disclosure.
Figure 7:
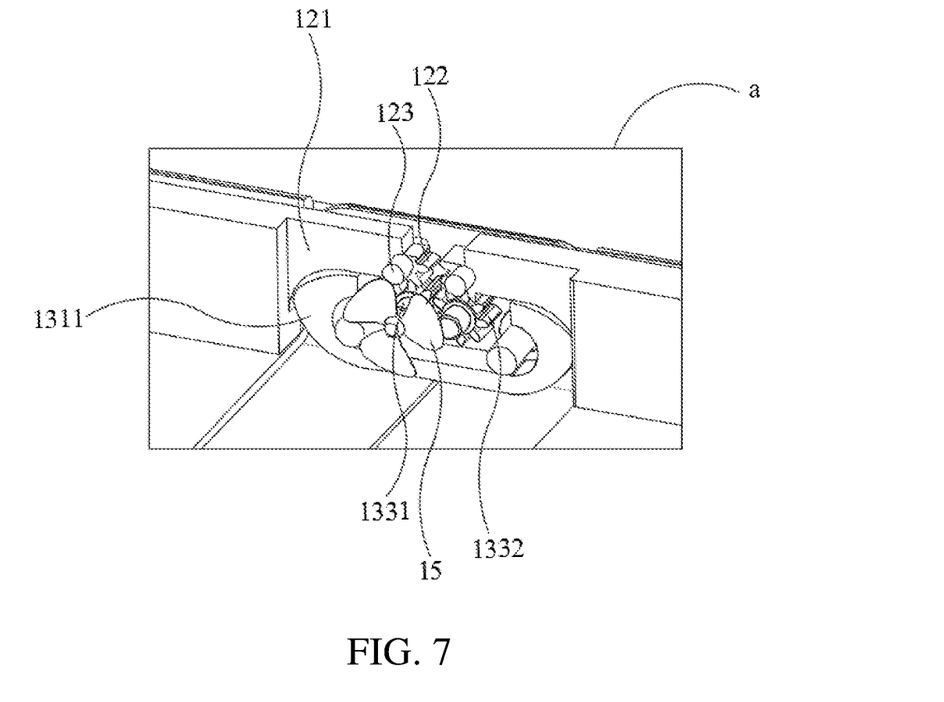
FIG. 7 is an internal structural schematic view of a component a provided in FIG. 1.
Figure 8:
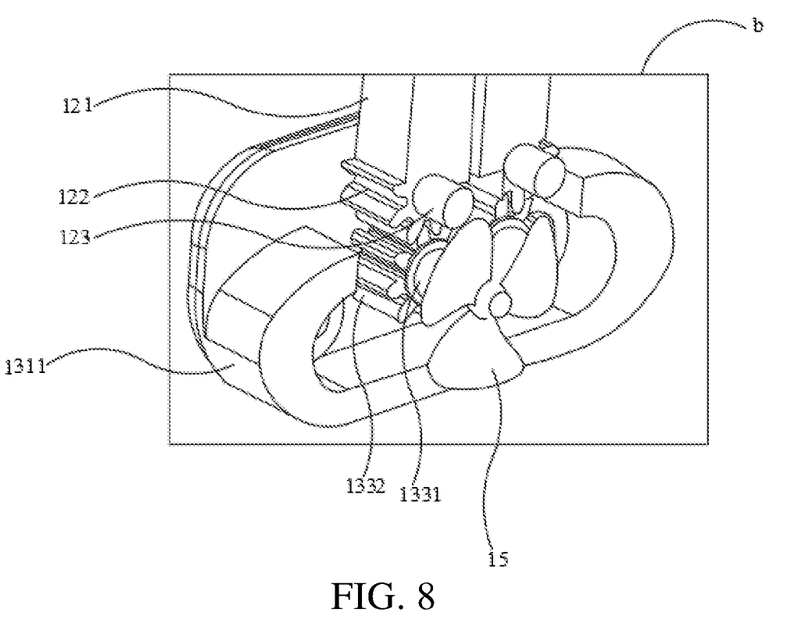
FIG. 8 is an internal structural schematic view of a component b provided in FIG. 2.

Also Referring to FIGS. 4 to 8. FIG. 4 is a structural schematic view of the connecting member 13 provided by an embodiment of the present disclosure. FIG. 5 is a top view of one end of the connecting member 13 provided in FIG. 4. FIG. 6 is a structural schematic view of a filter component provided by an embodiment of the present disclosure. FIG. 7 is an internal structural schematic view of a component a provided in FIG. 1. FIG. 8 is an internal structural schematic view of a component b provided in FIG. 2. The connecting member 13 includes two hinge covers 131, limit support housing 132 and rotation member 133. The two hinge covers 131 are respectively disposed on two ends of the limit support housing 132 and are fixedly connected with the limit support housing 132. The rotation member 133 is disposed between the hinge cover 131 and the limit support housing 132, and is separately movably connected with the hinge cover 131 and the limit support housing 132. The filter component 14 is disposed on a side of the rotation member 133 away from the hinge cover 131, so as to prevent the dust generated by friction between the components in the rotation member 133 and the dust entering the accommodating cavity from the external environment from through the gap between the components in the rotation member 133 at both ends of the connecting member 13, so as to avoid short circuits and malfunction display of the foldable display device 1.

Specifically, the limit support housing 132 includes a first support plate 1321 and a second support plate 1322 located on both ends of the first support plate 1321. The first support plate 1321 is a U-shaped groove structure, which provides supporting force for the two movable support plates 15 when the foldable display device 1 is in the flattening state. In addition, it may further limit the rotation angle of the two movable support plates 15, and the flexible display module 10 may provide with a deformed accommodating space during the folding process, so as to control a shape of a bending area of the flexible display module during the folding. In the folding or flattening state, the first support plate 1321 is connected with the bottom frame 11 to prevent the internal components from exposing.

One side of the second support plate 1322 closed to the hinge cover 131 is provided with threaded holes, and the hinge cover 131 is also provided with corresponding threaded holes, which is fixedly connected with the second support plate 1322 through threaded bolts 134. A top surface of the second support plate 1322 is provided with a slot 1323 recessed toward a bottom surface direction, and the filter component 14 is disposed in the card slot 1323.

The filter component 14 includes a filter mesh 141 and elastic hooks 142 provided on both sides of the filter mesh 141. A limit groove corresponding to the elastic hooks 142 is provided in the slot 1323. The filter component 14 can be fixed in the slot 1323 by using the elastic hooks 142. The mesh 141 is provided with mesh holes arranged continuously, and ventilation holes 1324 are provided on side walls of both sides of the slot 1323. The ventilation holes 1324 and the mesh holes can provide the internal and external air flow channels, and the filter mesh 141 can also filter the air flow from the external environment, so as to prevent the dust and other particles from entering the flexible display module 10 and an accommodating cavity formed among the two middle frames 12 and the bottom frame 11 through the two ends of the connecting member 13, so as to avoid short circuits and display malfunction.

Furthermore, an aperture of the mesh in the filter mesh 141 should be less than 0.2 μm, so as to block the particles with a size being larger than 0.2 μm and prevent the particles which is easy to cause short circuits and abnormal display from entering the accommodating cavity.

Specifically, taking the rotation member 133 on one side of the connecting member 13 as an example, the rotation member 133 includes two rotation shafts 1331 and two gears 1332 meshing with each other. An inner side of the hinge cover 131 is provided with a U-shaped groove 1311 extending in an opposite direction. The two gears 1332 are disposed in the U-shaped groove 1311 and are fixedly connected with the corresponding rotation shaft 1331, and are respectively movably connected with the hinge cover 131 and the second support plate 1322 through the rotation shaft 1331. The hinge cover 131 is provided with a first shaft hole corresponding to the rotation shaft 1331. A side of the second support plate 1322 closed to the hinge cover 131 is also provided with a second shaft hole corresponding to the rotation shaft 1331. Both ends of the rotation shaft 1331 are respectively arranged in the first shaft hole and the second shaft hole, and can rotate in the first shaft hole and the second shaft hole. A structure and function of the rotation member on the other side of the connecting member 13 is the same as that of the above-mentioned rotation member 133, which will not be describe in detail herein.

Furthermore, a side of the second support plate 1322 away from the rotation member 133 is provided with a fan blade component 15, and one of the two rotation shafts 1331 penetrates through the second support plate 1322 and is fixedly connected with the fan blade component 15.

Two ends of a side of the middle frame 12 closed to the connecting member 13 are provided with a connecting portion 121. An end of the connecting portion 121 is provided with a zigzag structure 122 distributed in an arc shape, which is approximately a quarter of a gear. The zigzag structure 122 is meshed with the gear 137 through an opening of the U-shaped groove 1311, and a top surface of the U-groove 1311 is used to support and limit a rotation angle of the connecting portion 121. The zigzag structure 122 is provided with a rotation shaft 123, the hinge cover 131 is provided with a third shaft hole corresponding to the rotation shaft 123, a side of the second support plate 1322 closed to the hinge cover 131 is also provided with a fourth shaft hole corresponding to the rotation shaft 123. Both ends of the rotation shaft 123 are respectively arranged in the third shaft hole and the fourth shaft hole, and can rotate in the third shaft hole and the fourth shaft hole.

During the flattened process or the folding process of the foldable display device 1, the middle frame 12 can rotate around the rotation shaft 123 and drive the gear 1332 to rotate through the zigzag structure 122. In this way, while the synchronous opening and closing of the two middle frames 12 is realized, the fan blade component 15 can be driven to rotate through the zigzag shaft 1331.

The following description is illustrated with FIG. 7 and FIG. 8 as examples. In order to illustrate an internal structure of the rotation member 13, the second support plate 1322 and the filter component 14 are not shown in FIG. 7 and FIG. 8. The detail illustration can refer to FIG. 4 to FIG. 6.

Taking one side of the connecting member 13 as an example, the fan blade component 15 is fixedly connected to the rotation shaft 1331 on a left side of the rotation member 133. When the foldable display device 1 is bent from a flattened state to a folded state, the left middle frame 12 rotates in a clockwise, and the left gear 1332 meshed with the zigzag structure 122 of the left middle frame 12 simultaneously rotates in a counterclockwise with the rotation shaft 1331, and drives the fan blade component 15 to rotate in the counterclockwise, so as to form a local negative pressure environment around the fan blade component 15 and generate an air flow from the interior of the accommodating cavity of the foldable display device 1 to the external environment through the filter component 14, thereby removing the dust generated by the friction of the gear and the rotation shaft in the rotation member 133 to the external environment, and preventing the dust from entering the accommodating cavity of the foldable display device 1 from the external environment.

During the process that the foldable display device 1 is from the folded state to the flattened state, the left middle frame 12 rotates in a counterclockwise, and the left gear 1332 meshed with the zigzag structure 122 of the left middle frame 12 simultaneously rotates in a clockwise with the rotation shaft 1331, and drives the fan blade component 15 to rotate in the clockwise, so as to form a local positive pressure environment around the fan blade component 15 and generate an air flow from the external environment to the accommodating cavity of the foldable display device 1 through the filter component 14. The filter component 14 can filter and purify the air flow flowing into the accommodating cavity, so as to block the dust in the external environment and the dust generated by the friction of the parts in the rotation member 133 at the side of the filter component 14 closed to the rotation member 133 to prevent it from entering the interior of the foldable display device 1 and avoid the occurrence of short circuits and display malfunction caused by the dust. The structure of the rotation member located on the other side of the connecting member 13 and the fan blade component and operation situation may be the same as above-mentioned structure, operation situation and function, and are not be describe in detail herein.

Figure 9:
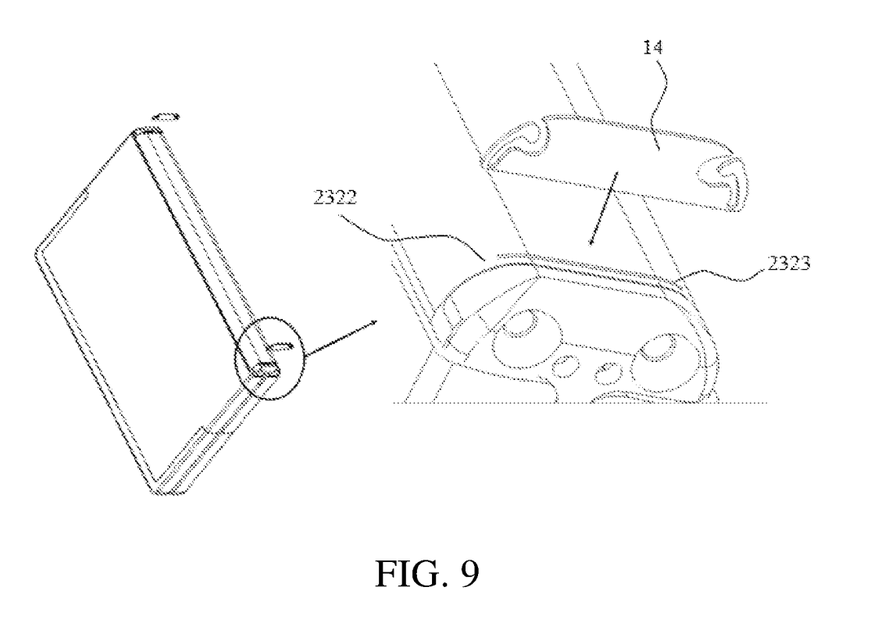
FIG. 9 is a schematic view of a bottom surface structure of a connecting member provided by an embodiment of the present disclosure.

In the embodiment of the present disclosure, as shown in FIG. 9, FIG. 9 is a schematic view of a bottom surface structure of the connecting member provided by an embodiment of the present disclosure. The slot 1323 penetrates from a top surface of the second support plate 134 to a bottom surface of the second support plate 134. The filter component 14 can be placed into the slot 1323 from the bottom surface of the second support plate 1322 in a direction of the arrow illustrated in the drawing. The filter component 14 is a special-shaped filter component, which can avoid the rotation shaft 1331 which is fixedly connected with the fan blade component 15, and is not interference with the rotation shaft 1331 during the installation and removal of the filter component.

If the dust deposited on the filter component 14 is more and affecting the ventilation and filtering effect of the filter component 14, the filter component 14 can be hooked out from the bottom of the second support plate 1322 through a pin and a new filter component can be replaced. There is no need to remove the flexible display module 10 and the middle frame 12, so as to reduce the difficulty of installation and replacement of the filter component, and it can also prevent the dust from entering the foldable display device 1 during the process of removing the flexible display module 10 and the middle frame 12. In addition, upper and lower sides of the filter component 14 need to be an interference fit with a top surface and a bottom surface of the slot 1323 to prevent the dust and other particles from entering the interior of the foldable display device 1 from the slot 1323.

In the embodiments of the present disclosure, the foldable display device 1 may also include a processor, a driver IC and a power supply component, the processor, the driver IC and the power supply component are separately disposed in the two middle frames 12 and connected with the flexible display module 10 through a flexible printed circuit board.

The beneficial effect of the embodiments of the present disclosure: the foldable flexible display device provided by the embodiments of the present disclosure dispose filter components that each is form by elastic hooks and a filter mesh on both ends of the connecting member, and the filter component is disposed on a side of the rotation member away from the hinge cover, so that an accommodating cavity formed by the flexible display module, the middle frames and the bottom frame communicates with the external environment through the filter component, so as to prevent the dust generated by the friction of components of the connecting member and the dust entering the accommodating cavity from the outside environment, thereby avoiding short circuits and display malfunction of the foldable display device.

Figure 10:
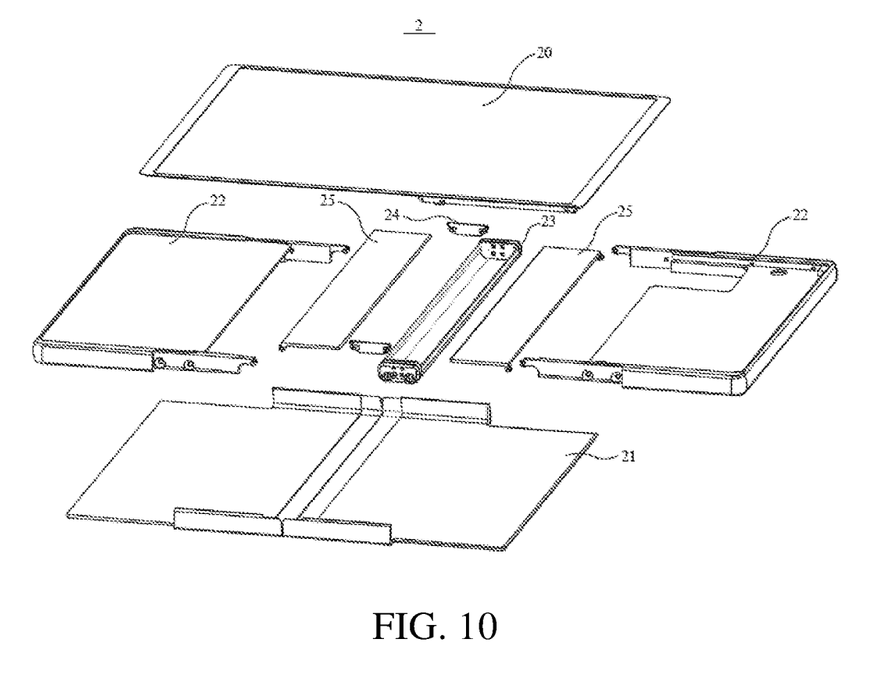
FIG. 10 is an exploded view of another foldable display device provided by an embodiment of the present disclosure.
Figure 11:
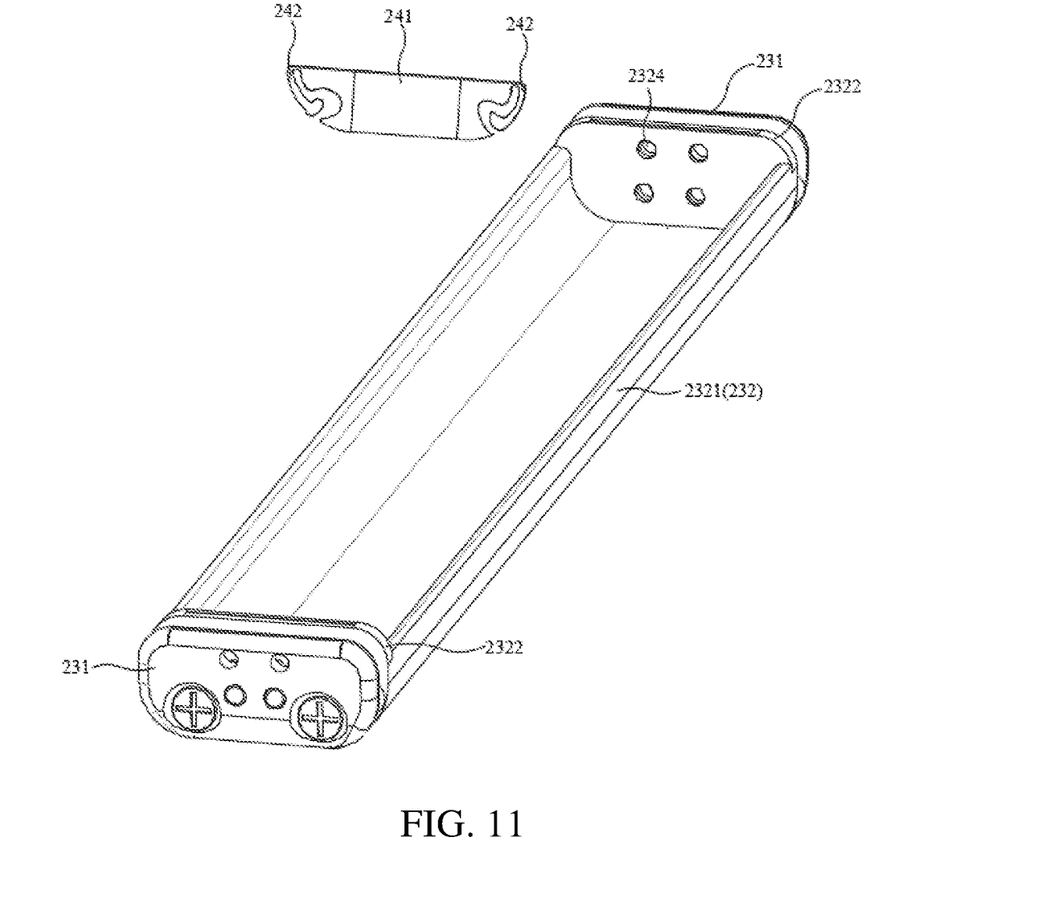
FIG. 11 is the structural schematic view of the connecting member and the filter component provided in FIG. 10.
Figure 12:
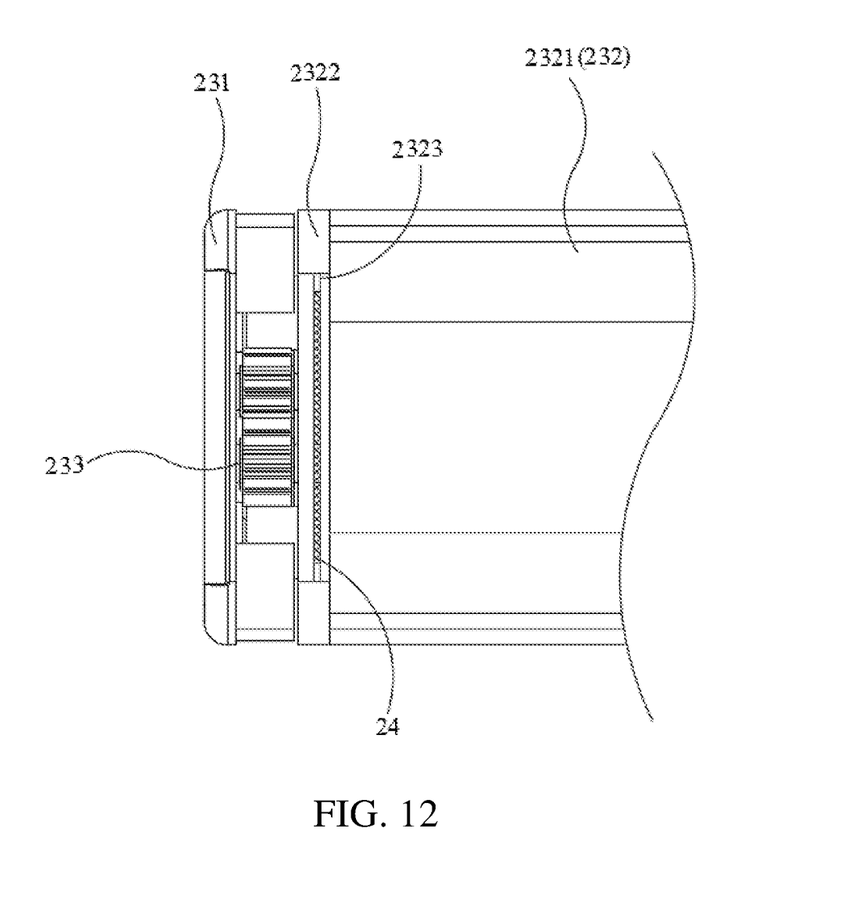
FIG. 12 is a top view of one end of the connecting member in FIG. 11.

An embodiment of the present disclosure also provides a foldable display device, as shown in FIGS. 10 to 12. FIG. 10 is an exploded view of another foldable display device 2 provided by an embodiment of the present disclosure, FIG. 11 is the structural schematic view of the connecting member 23 and the filter component 24 provided in FIG. 10, and FIG. 12 is a top view of one end of the connecting member 23.

The foldable flexible display device 2 includes a flexible display module 20; and a bottom frame 21, two middle frames 22, a connecting member 23 and two movable process support plates 25 which make the flexible display module 20 in a flattened state and a folded state. The position relationship and connection relationship among the bottom frame 21, the middle frames 22, the connecting member 23 and the two movable process support plates 25 may be the same as those above-mentioned embodiments, and is not described in detail herein. Both ends of the connecting member 23 are provided with a filter component 24. An accommodating cavity formed among the flexible display module 20, the two middle frames 22 and the bottom frame 21 is communicated with the external environment through the filter components 24.

The connecting member 23 includes two hinge covers 231, limit support housing 232 and rotation member 233, and the position relationship and the connection relationship among the components may be the same as the connecting member provided in the above-mentioned embodiments, and is not described in detail herein. The filter component 24 is disposed on a side of the rotation member 233 away from the hinge cover 231, so as to prevent the dust generated by friction between the components in the rotation structure 233 and the dust entering the accommodation cavity from the external environment from through the gap between the components in the rotation member 233 located at both ends of the connecting member 23, so as to avoid short circuits and display malfunction of the foldable display device 2.

In the embodiments of the present disclosure, a top surface of the second support plate 2322 is provided with a slot 2323 recessed toward a bottom surface direction, the filter component 24 is disposed in the slot 2323, and ventilation holes 2324 corresponding to the filter component 24 are provided on side walls of both sides of the slot 2323. The filter component 24 includes a diaphragm type check valve 241, which can also be fixed in the slot 2323 by elastic hooks 242 disposed on both sides of the diaphragm type check valve 2421. The structure of the rotation member 233 may be the same as that of the rotation member provided in the above-mentioned embodiments, and is not described in detail herein. Certainly, in some embodiments, the rotation member 233 may also be other hinge member or rotation shaft member, and is not limit herein.

During the process that the foldable display device 2 is from the flattened state to the folded state, a bending area of the flexible display module 20 recess to an U-shaped groove structure of the first support plate 2321, and compresses an internal space of the accommodation cavity of the foldable display device 1, so that the inside air pressure of the foldable display device 1 is greater than the air pressure of the external environment, due to its pressure difference, the diaphragm type check valve 241 is opened, at the same time, an air flow is generated from the accommodating cavity of the foldable display device 1 to the external environment through the diaphragm type check valve 241. While the air flows, the dust generated by the friction of the components in the rotation member 233 and the dust originally existing in the accommodating cavity is discharged to the external environment. When the process that the foldable display device 2 is from the folded state to the flattened state, the flexible display module 20 is also gradually regained to the flattened state, the diaphragm type check valve 241 is always kept closed, the dust in the external environment and the dust generated by the friction of the components in the rotation member 233 cannot enter the interior of the foldable display device 2, thereby avoiding the occurrence of short circuits and display malfunction caused by the dust.

The beneficial effect of the embodiments of the present disclosure: the foldable display device provided by the embodiments of the present disclosure dispose filter components that each is form by elastic hooks and a diaphragm type check valve on both ends of the connecting member, and the filter component is disposed on a side of the rotation member away from the hinge cover, so that an accommodating cavity formed by the flexible display module, the middle frames and the bottom frame communicates with the external environment through the filter component, so as to prevent the dust generated by the friction of components of the connecting member and the dust entering the accommodating cavity from the external environment, thereby avoiding short circuits and display malfunction of the foldable display device.

In view of above, the embodiments of the present disclosure provide a foldable display device. By disposing filter components at both ends of the connecting member, an accommodating cavity formed by the flexible display module, the middle frames and the bottom frame is communicating with the external environment through the filter component, so as to prevent the dust generated by friction of the components of the connecting member and the dust entering the accommodating cavity from the external environment, so as to avoid the short circuits of the foldable display device and the display malfunction.

In summary, although the present disclosure is disclosed by the preferred embodiments, the above preferred embodiment is not used to limit the present disclosure. Those skilled in the art can make various modification and amendments without departing from the spirit and scope of the present disclosure. Therefore, the protection scope of the present disclosure is based on the scope defined in the claims.

The invention claimed is:

1. A foldable display device, comprising a flexible display module; a bottom frame configured for making the flexible display module in a flattened state and a folded state; two middle frames; and a connecting member, wherein the middle frames and the connecting member are disposed on the bottom frame, the two middle frames are respectively arranged on both sides of the connecting member and rotatably connected with the connecting member, and the flexible display module is disposed on the middle frame and covering the connecting member, and wherein filter components are provided on two ends of the connecting member, and an accommodating cavity is formed among the flexible display module, the middle frames and the bottom frame communicating with an external environment through the filter components, wherein the connecting member comprises a limit support housing, and the limit support housing comprises a first support plate and two second support plates located on both ends of the first support plate; and a slot provided on a top surface of the second support plate and recessed toward a direction of the bottom surface of the second support plate, and the filter component disposed in the slot, and wherein the filter component further comprises elastic hooks provided on both sides of the filter component, and a limiting groove is provided in the slot corresponding to the elastic hook.

2. The foldable display device according to claim 1, wherein the connecting member comprises hinge covers and a rotation member, the hinge covers disposed on two ends of the limit support housing, the rotation member disposed between the hinge cover and the limit support housing, and the filter component disposed on a side of the rotation member away from the hinge cover.

3. The foldable display device according to claim 1, wherein the filter component comprises a filter mesh.

4. The foldable display device according to claim 3, wherein the rotation member comprises two rotation shafts and two gears meshing with each other, the gear movably connected with the hinge cover through the rotation shaft, and wherein a fan blade component is provided on a side of the second support plate away from the rotation member, and one of the two rotation shafts penetrates the second support plate and is fixedly connected with the fan blade component.

5. The foldable display device according to claim 4, wherein connecting portions provides on two ends of a side of the middle frame closed to the connecting member, an end of the connecting portion provided with a zigzag structure distributed in an arc shape, and the zigzag structure meshes with the gear.

6. The foldable display device according to claim 1, wherein the filter component comprises a diaphragm type check valve.

7. The foldable display device according to claim 6, wherein the filter component further comprises elastic hooks provided on both sides, and a limiting groove is provided in the slot corresponding to the elastic hook.

8. The foldable display device according to claim 1, wherein ventilation holes corresponding to the filter component are provided on both sides of the slot.

9. The foldable display device according to claim 1, wherein the slot penetrates from the top surface of the second support plate to a bottom surface of the second support plate.

10. A foldable display device, comprising a flexible display module; a bottom frame configured for making the flexible display module in a flattened state and a folded state; two middle frames; and a connecting member, wherein the middle frames and the connecting member are disposed on the bottom frame, the two middle frames are respectively arranged on both sides of the connecting member and rotatably connected with the connecting member, and the flexible display module is disposed on the middle frame and covering the connecting member, wherein the connecting member comprises hinge covers, a limit support housing and a rotation member, the hinge covers disposed on two ends of the limit support housing, the rotation member disposed between the hinge cover and the limit support housing, the limit support housing comprises a first support plate and two second support plates located on both ends of the first support plate; and a slot recessed toward a bottom surface direction provided on top surfaces of the two second support plate, the a filter component disposed in the slot, and an accommodating cavity formed among the flexible display module, the middle frames and the bottom frame communicating with an external environment through the filter components, wherein the filter component further comprises elastic hooks provided on both sides of the filter component, and a limiting groove is provided in the slot corresponding to the elastic hook.

11. The foldable display device according to claim 10, wherein the filter component comprises a filter mesh.

12. The foldable display device according to claim 11, wherein the rotation member comprises two rotation shafts and two gears meshing with each other, the gear movably connected with the hinge cover through the rotation shaft; and wherein a fan blade component is provided on a side of the second support plate away from the rotation member, and one of the two rotation shafts penetrates the second support plate and is fixedly connected with the fan blade component.

13. The foldable display device according to claim 12, wherein connecting portions provides on two ends of a side of the middle frame closed to the connecting member, an end of the connecting portion provided with a zigzag structure distributed in an arc shape, and the zigzag structure meshes with the gear.

14. The foldable display device according to claim 10, wherein the filter component comprises a diaphragm type check valve.

15. The foldable display device according to claim 10, wherein ventilation holes corresponding to the filter component are provided on both sides of the slot.

16. The foldable display device according to claim 10, wherein the slot penetrates from the top surface of the second support plate to a bottom surface of the second support plate.

17. A foldable display device, comprising a flexible display module; a bottom frame configured for making the flexible display module in a flattened state and a folded state; two middle frames; and a connecting member, wherein the middle frames and the connecting member are disposed on the bottom frame, the two middle frames are respectively arranged on both sides of the connecting member and rotatably connected with the connecting member, and the flexible display module is disposed on the middle frame and covering the connecting member, wherein the connecting member comprises hinge covers, a limit support housing and a rotation member, the hinge covers disposed on two ends of the limit support housing, and the rotation member disposed between the hinge cover and the limit support housing, the limit support housing comprises a first support plate and two second support plates located on both ends of the first support plate, a slot recessed toward a bottom surface direction provided on a top surface of the two second support plate, and a filter component disposed in the slot, wherein the filter component comprises a filter mesh and elastic hooks provided on both sides; a limiting groove is provided in the slot corresponding to the elastic hook; and an accommodating cavity is formed among the flexible display module, the middle frames and the bottom frame communicating with an external environment through the filter components.

18. The foldable display device according to claim 17, wherein the rotation member comprises two rotation shafts and two gears meshing with each other, the gear movably connected with the hinge cover through the rotation shaft; a fan blade component provided on a side of the second support plate away from the rotation member, and one of the two rotation shafts penetrates the second support plate and is fixedly connected with the fan blade component.

\* \* \* \* \*